(12) United States Patent
Beukema

(10) Patent No.: US 6,393,083 B1
(45) Date of Patent: May 21, 2002

(54) APPARATUS AND METHOD FOR HARDWARE IMPLEMENTATION OF A DIGITAL PHASE SHIFTER

(75) Inventor: Troy J. Beukema, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/126,990

(22) Filed: Jul. 31, 1998

(51) Int. Cl.[7] ............................................... H04L 25/00
(52) U.S. Cl. ..................... 375/371; 327/234; 327/235; 327/237
(58) Field of Search ................. 375/371; 327/231, 327/233, 234, 235, 237, 238, 240, 254

(56) References Cited

U.S. PATENT DOCUMENTS 4,736,328 A * 4/1988 Vatis et al. ................. 307/511
5,451,894 A * 9/1995 Guo ............................ 327/241
5,797,847 A * 8/1998 Miller et al. ................ 327/254

* cited by examiner

*Primary Examiner*—Don N. Vo
(74) *Attorney, Agent, or Firm*—F. Chau & Associates, LLP

(57) ABSTRACT

An apparatus and method for an improved hardware implementation of a digital phase shifter which provides a simplified process for phase correction of digital signals and eliminates the use of a lookup ROM and complex digital Multipliers. The digital phase shifter operates by applying a phase correction to complex digital I/Q samples in separate stages, where each stage performs a phase rotation by an amount specified directly by the binary values of an integer input phase. In one aspect, an apparatus for applying a phase shift to a complex digital signal comprises a plurality of phase shift stages each having a phase shift value associated therewith, whereby each of the plurality of phase shift stages selectively applies the corresponding phase shift value to the complex digital signal.

20 Claims, 7 Drawing Sheets

Mapping of Binary Phase Digits to Phase Value

Integer phase = b5 * $2^5$ + b4 * $2^4$ + b3 * $2^3$ + b2 * $2^2$ + b1 * $2^1$ + b0

| Binary digits | b5 | b4 | b3 | b2 | b1 | b0 |
|---|---|---|---|---|---|---|
| Phase Weight | $\pi$ | $\pi/2$ | $\pi/4$ | $\pi/8$ | $\pi/16$ | $\pi/32$ |

APPARATUS AND METHOD FOR HARDWARE IMPLEMENTATION OF A DIGITAL PHASE SHIFTER

BACKGROUND

1. Technical Field

The present application relates generally to a digital phase shifter and, more particularly, to an apparatus and method for providing an improved hardware implementation of a digital phase shifter.

2. Description of the Related Art

Modern communications systems often require the implementation of complex digital signal processing algorithms. One such algorithm is used in a conventional digital phase shifter (or mixer). A digital phase shifter is a key functional component in a large number of modern communication systems such as Direct Satellite System (DSS) receivers, digital cellular phones, satellite modems, and wireless local area network (LAN) modems. In particular, one important application of the digital phase shifter is in a digital phase-locked loop (PLL) which is used to remove phase and/or frequency error from a received signal. The use of digital PLLs simplify system design by obviating the need for external analog voltage-controlled oscillators and associated circuitry.

Referring now to FIG. 1, a block diagram illustrates a conventional digital communications demodulator having a digital phase shifter. The operation of the conventional digital phase shifter will be described in the context of the digital communications demodulator since this is one of its primary applications. In the system diagram of FIG. 1, a radio signal is received by an antenna 10 and then translated from a carrier frequency to baseband (or "zero-IF") I and Q signals by a quadrature demodulator 12. The baseband I and Q signals (i.e., complex signals) respectively refer to the "in-phase" and "quadrature phase" components of the radio signal. As shown in FIG. 2, the I and Q baseband signals form a complex vector "z" in a cartesian plane, where the tip of the vector "z" is equal to (I+jQ). In addition z, I and Q can be represented as a function of time using the functional notation $z(t)=I(t)+jQ(t)$, where "j" is equal to the square root of negative 1, and represents a location in the Cartesian plane of (0,1).

Referring back to FIG. 1, the analog I and Q signals from the quadrature demodulator 12 are digitized by a first analog-to-digital (A/D) converter 14 and a second A/D converter 16, respectively, and the digitized I and Q signals are sent to a digital demodulator 18. The digital demodulator 18 includes a digital phase shifter (mixer) 20 which receives the digitized I and Q signals and mixes them with a locally generated phase reference $\phi(n)$ so as to apply a phase correction to the digitized samples. The phase is normally updated on a sample-by-sample basis so that the system can remove the phase error effects due to frequency offset or other dynamic phase fluctuations which may occur during transmission in the radio channel. The phase-corrected samples are then integrated by a matched-filter correlator 22 which produces an estimate of the transmitted information symbol. The transmitted information symbol is transformed into information bits (data) by a decoder 24.

The phase reference $\phi(n)$ is typically provided by a carrier recovery module 26 which utilizes an algorithm that is driven by symbol decision-error directed computations provided by the decoder 24. The carrier recovery module 26 determines the correct phase $\phi(n)$ to apply to the digital phase shifter 20 in order to cancel the phase error on the digitized I/Q samples that are received by the digital demodulator 18. In particular, the digital phase shifter 20 rotates the vector $z=I+jQ$ (which represents corresponding I/Q samples) by the phase reference angle $\phi(n)$. Mathematically, the rotation of the complex vector "z" by phase "$\phi$" is accomplished through multiplication with a complex exponential $e^{j\phi}$ (i.e., $(I+jQ)*e^{j\phi}$).

Typically, conventional digital phase shifters used in high data rate systems such as DSS receivers or high speed wireless LANs are implemented in hardware. The conventional hardware-based digital phase shifter employs a read-only memory (ROM) lookup table and a complex-multiply operation. Referring now to FIG. 3, a block diagram illustrates a conventional hardware realization for a conventional digital phase shifter, such as the one shown in FIG. 1. In FIG. 3, I(n) and Q(n) represent discrete samples which are received by the digital phase shifter 20, $\phi(n)$ represents the correction phase applied to the input I(n) and Q(n) samples, and Iout(n) and Qout(n) represent the phase-corrected samples output from the digital phase shifter 20. The digital phase shifter 20 includes a complex multiply module 20b which multiplies the input samples I(n) and Q(n) (i.e., $I(n)+jQ(n)$) by the complex exponential $e^{j\phi}$. Specifically, since $e^{j\phi}=\cos(\phi)+j\sin(\phi)$ by Euler's identity, the complex multiply module 20b performs a fast phase-rotation by first retrieving the values for $\cos(\phi)$ and $\sin(\phi)$ from a lookup ROM 20a, and then performing one complex multiplication (i.e., $[I(n)+jQ(n)]*[\cos(\phi)+j\sin(\phi)]$) to form the phase-rotated output samples (i.e., $Iout(n)=I(n)\cos(\phi)-Q(n)\sin(\phi)$ and $Qout(n)=I(n)\sin(\phi)+Q(n)\cos(\phi)$).

As shown, the complex multiplication requires four multiplications and two additions to generate the phase-corrected output samples. The complex multiplication process of the conventional digital phase shifter 20 requires the implementation of sophisticated digital multipliers. There is a need, therefore, for an improved hardware-based digital phase shifter which utilizes a simplified phase correction process and obviates the need for the complex digital multipliers and ROM of the conventional hardware-based digital phase shifter.

SUMMARY

The present application is directed to an apparatus and method for an improved hardware implementation of a digital phase shifter which provides a simplified process for phase correction of digital signals and eliminates the use of a lookup ROM and complex digital multipliers. The present digital phase shifter operates by applying a phase correction to digital samples in separate phase-shift stages, where each phase-shift stage performs a phase rotation by an amount specified directly by the binary values of an integer input phase.

In one aspect, an apparatus for applying a phase shift to a complex digital signal, comprises: a plurality of phase shift stages each having a phase shift value associated therewith, whereby each of said plurality of phase shift stages selectively applies the corresponding phase shift value to the complex digital signal.

DESCRIPTION OF PREFERRED EMBODIMENTS

Figure 1:
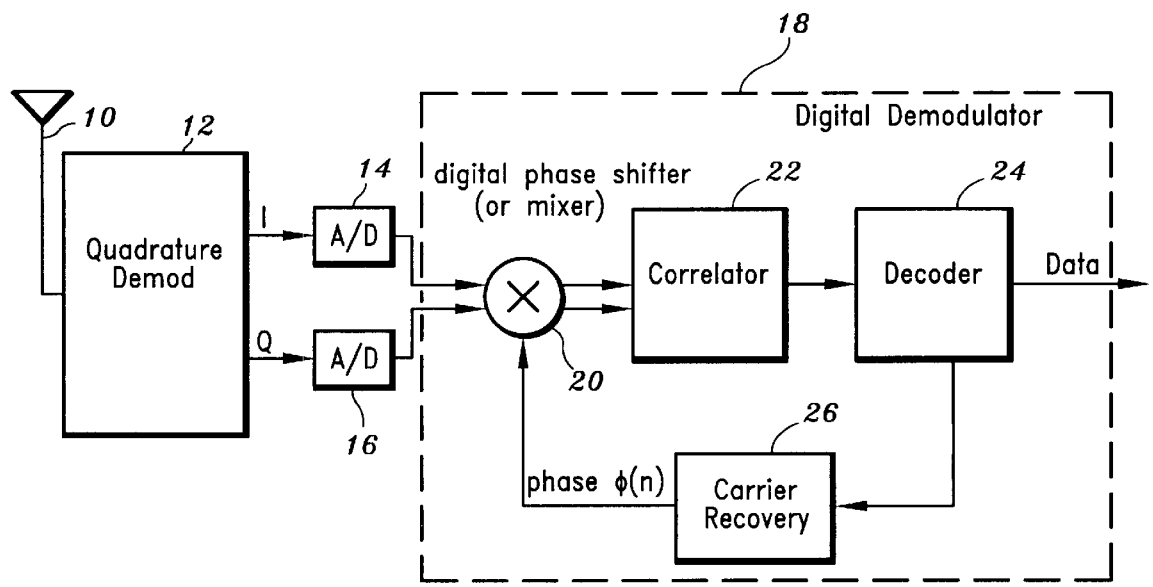
FIG. 1 is a block diagram which illustrates a conventional digital communications demodulator using a conventional digital phase shifter.
Figure 2:
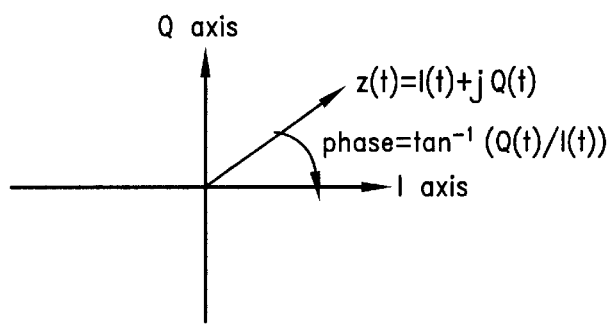
FIG. 2 is a graphical illustration of an I/Q modulation signal in cartesian plane.
Figure 3:
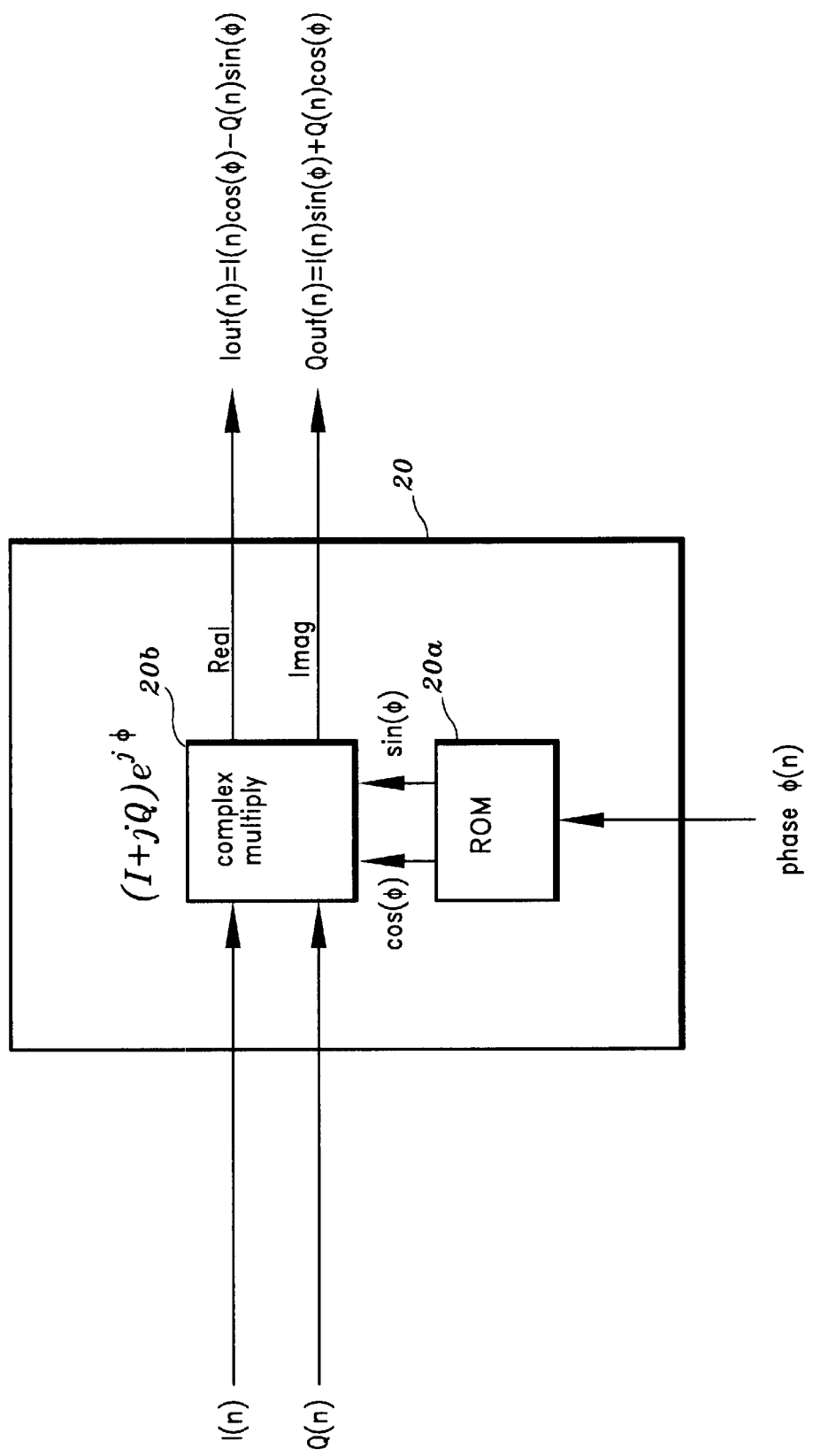
FIG. 3 is a block diagram of a conventional hardware digital phase shifter.
Figures 4, 5:
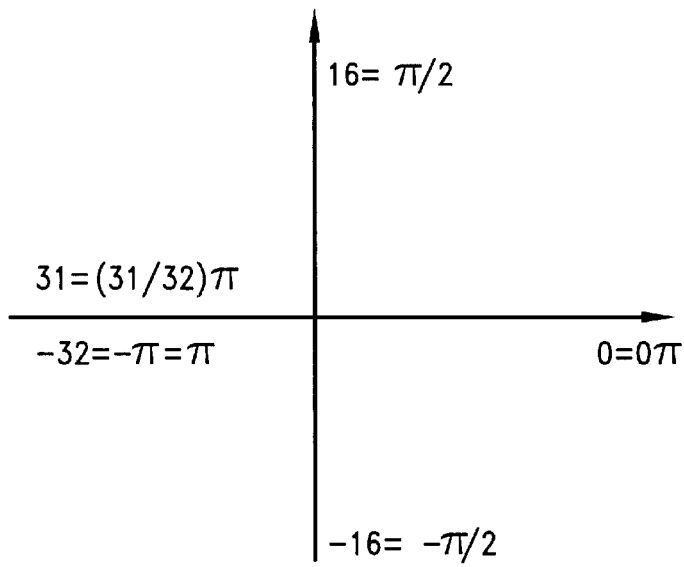
FIG. 4 is a diagram which illustrates a mapping of integer values to phase values in a complex plane in accordance with one aspect of the present invention.
FIG. 5 is a diagram which illustrates a mapping of binary phase digits to phase value in accordance with one aspect of the present invention.

In general, the input phase in a hardware based digital signal processing system is normally represented as a 2's complement integer. A 2's complement system with "N" bits of precision can represent integer values ranging from $-2^{(N-1)}$ to $2^{(N-1)}-1$. For example, assuming N=6, 64 integer values in the range from −32 to 31 can be represented. Assuming further (for N=6) that the integer values are used to represent phase values, the minimum integer value −32 can represent a phase value of $-\pi$ (or $\pi$) radians, −16 can represent a phase value $-\pi/2$ radians, and 16 can represent a phase value of $\pi/2$. This mapping of integer values to phase values in a complex plane is shown in FIG. 4.

Now assuming further that the 2's complement integer phase value is represented in binary form, then each binary digit can represent a phase value proportional to its numerical value. In particular, each bit of a binary number has a weight associated therewith. Since each bit can be only one of two values (i.e., 0 or 1) the weights ascend in powers of 2. For example, with N=6 (i.e, a binary number having the bit string b5, b4, b3, b2, b1, b0) a binary weight of 32, 16, 8, 4, 2 and 1 is associated with bits b5, b4, b3, b2, b1, b0, respectively. Therefore, the binary weight 32 for bit b5 can represent $-\pi$ (or equivalently, $\pi$), the binary weight of 16 for bit b4 can represent $\pi/2$, the binary weight of 8 for b3 can represent $\pi/4$, the binary weight of 4 for b2 can represent $\pi/8$, the binary weight of 2 for bit b1 can represent $\pi/16$, and the binary weight of 1 for bit b0 can represent $\pi/32$. This mapping of binary digits of the integer phase to phase values is shown in FIG. 5.

Figure 6:
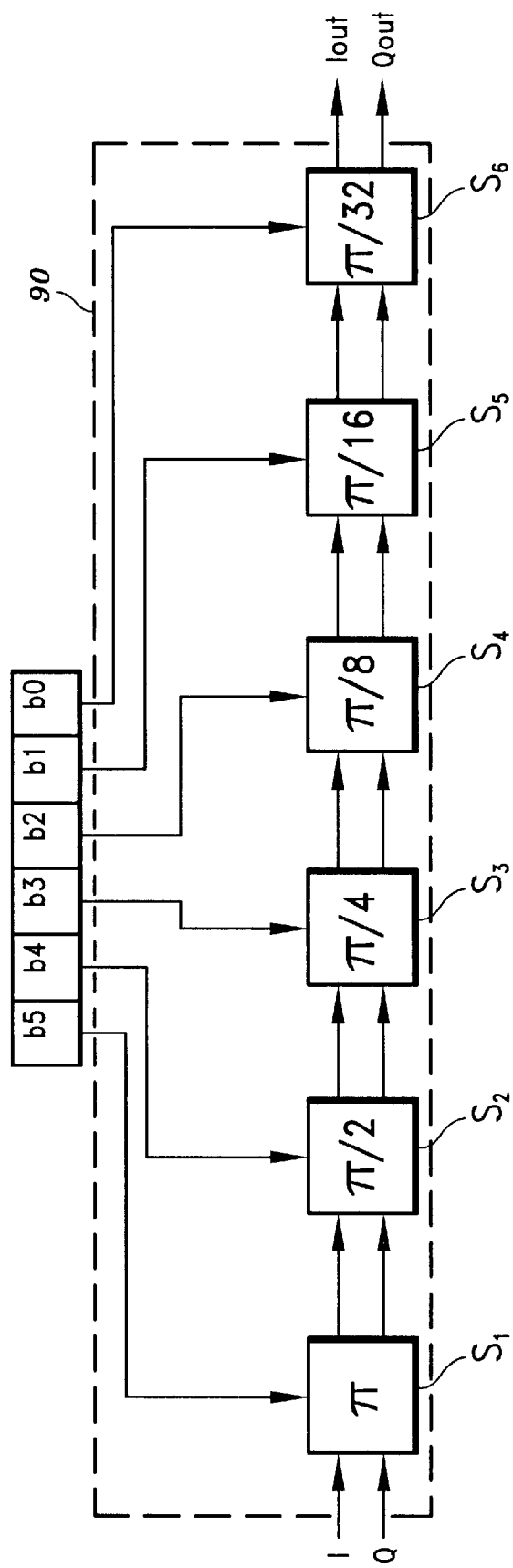
FIG. 6 is a block/flow diagram which illustrates a binary phase shifter having a cascade of binary phase-shift stages for performing phase rotation in accordance with an embodiment of the present invention.

Referring now to FIG. 6, a block diagram illustrates a binary phase shifter having a cascade of binary phase-shift stages for performing phase rotation in accordance with one embodiment of the present invention. In particular, FIG. 6 illustrates a preferred phase correction method (i.e., phase rotation) using a 6-bit integer phase value, whereby a phase shift is applied to a complex number (i.e., I/Q sample pair) by sending the complex number through a cascade of phase-shift stages S1–S6. Each phase-shift stage adds the appropriate phase weight for the corresponding binary digit of the integer phase. In particular, each phase-shift stage in the phase-rotation cascade applies a phase shift corresponding to the weight of the binary phase bit which controls it. If the binary integer phase bit is logic "0" for a corresponding phase-shift stage, the phase-shift stage will pass the complex number through with no phase rotation. On the other hand, if the respective binary integer phase bit is logic "1", the phase-shift stage will add a phase shift corresponding to the phase weight of its binary digit to the complex number. It is to be appreciated that a 6-bit integer phase provides a phase quantization interval of 360°/64, or approximately 6°, which is adequate accuracy for use with a quadrature-phase shift keyed (QPSK) system.

Figure 7:
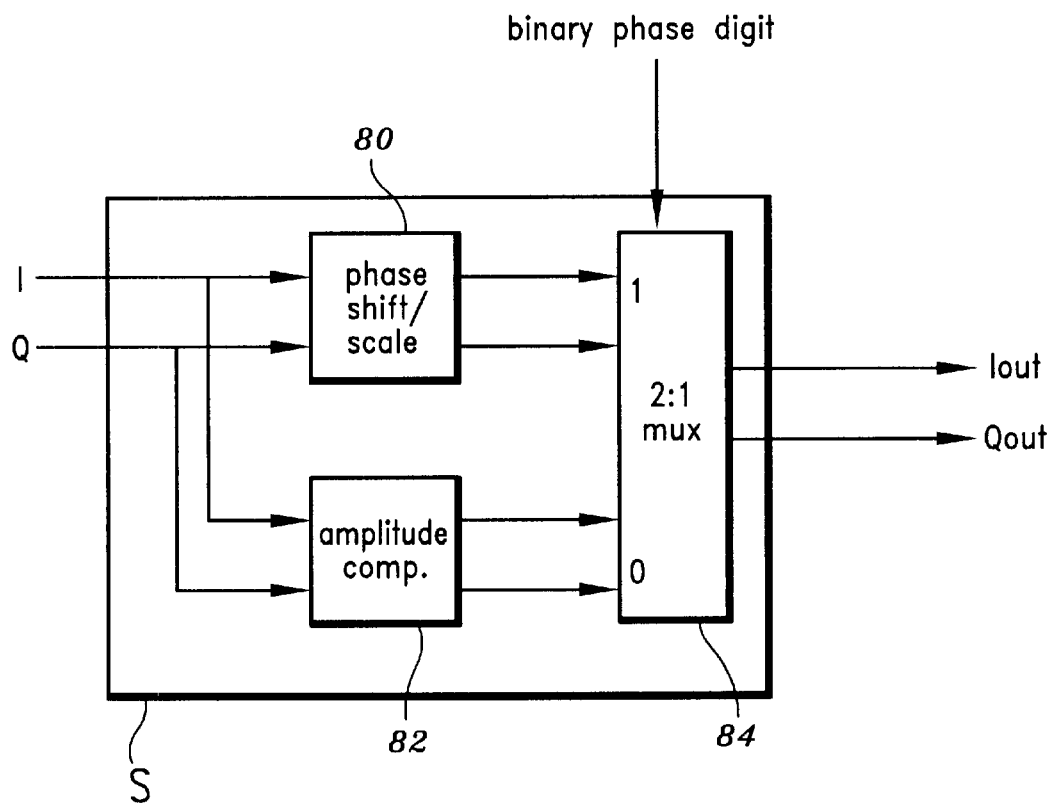
FIG. 7 is a block diagram which illustrates components of a binary phase-shift stage in accordance with an embodiment of the present invention.

Advantageously, the embodiment shown in FIG. 6 avoids the computation of a complex exponential (which, as stated above, is typically performed with a ROM lookup table) since it directly applies the phase rotation prescribed by the binary bits of the integer phase value. More importantly, it is possible to efficiently approximate the required phase rotation in each of the phase-shift stages using low complexity binary shifters, adders, and negates. Notwithstanding that these approximations typically add some phase and amplitude error to the resulting output, it is possible to achieve sufficiently accurate results to render viable the direct-phase rotation concept shown in FIG. 6 for use in many communications systems when distortion associated with imperfect rotation (i.e., approximation) is negligible as compared to other system degradations such as thermal noise. Referring now to FIG. 7, a diagram illustrates components of a binary phase-shift stage S shown in FIG. 6. Each phase-shift stage includes a "phase-shift path" having a phase shift/scaling module 80 for applying the prescribed phase rotation and amplitude scaling factor to the input complex number (i.e., I/Q signals). The phase-shift stage also includes a "non-phase-shift path" having an amplitude compensation module 82 which provides the appropriate amplitude scaling factor when the I/Q signals are passed through the phase-shift stage S with no phase rotation. A 2:1 multiplexer 84 switches between the phase-shift and non-phase-shift paths in response to the corresponding binary phase bit of the integer phase. In particular, when the input binary phase digit is logic "1", the multiplexer will allow the phase-shifted I/Q signals to pass (i.e., the phase shifter applies the prescribed phase rotation to the input complex number). When the input binary phase bit is logic "0", the multiplexer will only pass the I/Q signals with the scaled amplitude (i.e., the phase-shifter passes the complex input through unchanged in phase, but with a scaled amplitude).

It is to be understood that the amplitude scaling factor that is applied in the amplitude compensation module 82 is similar to the prescribed amplitude scaling which occurs in the phase shift/scaling module 80 so that the amplitude gain of the I/Q signals in the phase-shift or non-phase shift path is as identical as possible. This is done to prevent unwanted phase-shift dependent amplitude modulation of the signal by the phase mixer. It is to be further understood that, although a fixed amplitude scale may be applied in each of the phase-shift stages in the phase shift-cascade, an amplitude scale factor can be applied with a separate scaling stage after the last phase-shift stage to provide the desired signal output level.

It is to be appreciated that not all of the phase-shift stages shown in FIG. 6 are required to have the structure shown in FIG. 7. For instance, a phase rotation by "$\pi$" is equivalent to multiplication by −1. Consequently, the "$\pi$" phase shift can be implemented using a single negation structure (as explained in further detail below with reference to FIG. 9). It is to be further appreciated that, as stated above, in order to efficiently implement the phase-shift process in the other phase-shift stages, the prescribed phase shifts should be realized using low complexity binary shifters and adders. Consequently, the actual complex multiplication factors for the phase-shift/scale modules 80 in each of the phase-shift stages should closely approximate the prescribed phase shift.

Table 1 contains the preferred effective complex multiplication factors which can be used for 6-bit phase quantization. In Table 1, the "Rotation" column lists the prescribed phase rotation for each of the binary phase-shift stages shown in FIG. 6. The "Complex Multiplier" column lists the approximate complex multiplication factors used to obtain the prescribed phase-shifts for the corresponding binary phase-shift stages. The "Amplitude" column lists the amplitude scaling factor that is realized in accordance with the corresponding complex multiplication factor and the "Phase Error" column lists the phase error that results from utilizing the corresponding complex multiplication factor.

TABLE 1

Binary Phase Shifter Phase and Amplitude Approximations

| Rotation | Complex Multiplier | Amplitude | Phase Error (deg.) |
|---|---|---|---|
| π | −1 + j0 | 1.0 | 0.0 |
| π/2.0 | 0 + j1 | 1.0 | 0.0 |
| π/4.0 | 1 + j1 | 1.414 | 0.0 |
| π/8.0 | 1 + j½ | 1.118 | +4.06 |
| π/16.0 | 1 + j¼ | 1.031 | +2.78 |
| π/32.0 | 1 + j⅛ | 1.008 | +1.50 |

In particular, the phase error refers to the difference between the prescribed phase rotation and the phase rotation that results from utilizing the approximated complex multiplication factor. It is to be understood that since (as stated above) the prescribed phase shifts in each of the phase-shift stages are preferably performed using low complexity binary shifts and additions, the complex multiplication factors in Table 1 are chosen such that they can be realized with low complexity binary adders and binary shifters, while at the same time providing a phase component which is close to the prescribed phase rotation. For example, for π/8.0 (i.e., 22.5°), the corresponding complex multiplication factor of 1+j.5 provides a phase shift of $\tan^{-1}$ (0.5/1)=26.57°, thereby resulting in a phase error of (26.56°)−(22.5°)=4.06°.

Furthermore, the amplitude scaling factors can be adjusted for the amplitude compensation module 82 in the non-phase rotated paths of the phase-shift stages such that the amplitude compensation module 82 can be realized using low complexity binary shifters and adders. For instance the amplitude scaling factor of 1.414 corresponding to the complex multiplication factor 1+j1 for the π/4 phase-shift stage is adjusted to an amplitude scaling factor of 1.5 which can be efficiently realized with one binary addition. It is to be understood that more accurate amplitude scaling factors can be realized at the expense of additional hardware.

In Table 2 below, the "Amplitude Comp." column lists preferred amplitude error compensation values which can be implemented in the amplitude compensation module 82. The "Amplitude Comp/Amplitude" column lists the corresponding ratio of the compensated amplitude scaling in the non-phase-rotated path to the amplitude scaling in the phase-rotated path for each of the phase-shift stages. As shown in Table 2, there is no amplitude compensation applied in the non-phase-rotated paths for the phase-shift stages π, π/2, π/16 and π/32. In particular, for π and π/2, no amplitude compensation is required in the non-phase-rotated path because the resulting amplitude scaling in the phase-rotated path is equal to 1 (as-shown in the "Amplitude" column). In addition, no amplitude compensation is required in the non-phase rotated paths for the phase-shift stages π/16 and π/32 since the corresponding amplitude scaling in the phase-rotated paths is virtually 1.

TABLE 2

Amplitude Error Compensation

| Rotation | Complex Multiplier | Amplitude | Amplitude Comp. | Amplitude Comp/Amplitude |
|---|---|---|---|---|
| π | −1 + j0 | 1.0 | 1.0 (none) | 1.000 |
| π/2.0 | 0 + j1 | 1.0 | 1.0 (none) | 1.000 |
| π/4.0 | 1 + j1 | 1.414 | 1.5 | 1.060 |
| π/8.0 | 1 + j½ | 1.118 | 1.125 | 1.006 |
| π/16.0 | 1 + j¼ | 1.031 | 1.0 (none) | 0.970 |
| π/32.0 | 1 + j⅛ | 1.008 | 1.0 (none) | 0.992 |

It is to be appreciated that since the phase error at any given phase-shift stage is a known function of the input phase, phase error compensation can also be designed into the system. In particular, referring back to Table 1, the only phase error incurred due to the preferred complex multiplication factors is in the lower 3 bits of the 6-bit binary integer phase. In other words, only the preferred complex multiplication factors which are approximated for the π/8, π/16 and π/32 phase-shift stages result in any phase error. Consequently, all phase error combinations may be found by examining the lower three bits of the integer phase value.

This concept is illustrated in Table 3 below, which lists the resulting phase error for all combinations of the lower three bits of the binary integer phase. For instance, notwithstanding the logic state of the upper three bits of the preferred six bit integer phase, when the lower three bits are "1 0 1", the resulting phase error is 5.57° (i.e. 4.06°+1.50°). Indeed, the greatest phase error of +8.34° occurs when all three low order bits are logic "1" (i.e., when all three lower bits select phase rotation for the corresponding phase-shift stage).

TABLE 3

Phase Error Compensation

| b2 b1 b0 | Phase Error | Phase Compensation | Compensated Phase Error |
|---|---|---|---|
| 1 1 1 | 8.35 | −7.125 | 1.23 |
| 1 1 0 | 6.85 | −7.125 | −2.74 |
| 1 0 1 | 5.57 | −7.125 | −1.56 |
| 1 0 0 | 4.07 | −7.125 | −3.06 |
| 0 1 1 | 4.29 | −7.125 | −2.84 |
| 0 1 0 | 2.79 | 0.0 | 2.79 |
| 0 0 1 | 1.50 | 0.0 | 1.50 |
| 0 0 0 | 0.0 | 0.0 | 0.0 |

It is to be appreciated that the phase error in the system as a result of the complex multiplication factors for the lower three bits of the input phase can be reduced by initially compensating the input phase value. In particular, since a rotation by 1+j⅛ is equal to +7.125 degrees, the maximum error of 8.35° can be compensated by subtracting one from the input phase value. Referring to Table 3, a comparison is shown between the "phase error" associated with the various low-order phase bit patterns using no phase compensation and the corresponding "compensated phase error" using the optimal "phase compensation" for all possible error patterns of input phase. For the lower 3 bit combinations having decimal equivalent values of 0, 1 and 2, the phase error is negligible and is not compensated.

As shown in Table 3, the "compensated phase error" values range from −2.84° to +3.06° with a mean error of −0.3°. Since the phase quantization is equal to 5.625° (i.e., 360°/64) when the preferred 6-bit integer phase is used, the range of the compensated phase error values is only slightly larger than the phase error that results from phase quantization alone, which is −2.8125° to +2.8125°.

Figure 8:
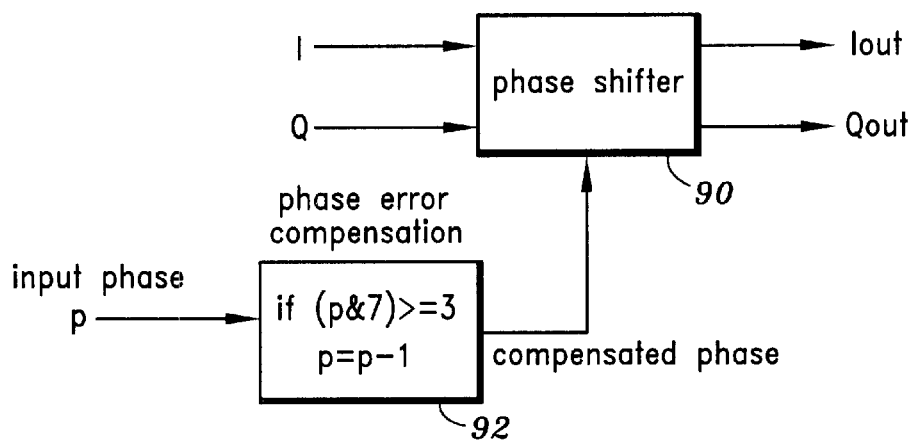
FIG. 8 is a block/flow diagram which illustrates phase error compensation in accordance with one aspect of the present invention.

Referring now to FIG. 8, a block/flow diagram illustrates a method for phase error compensation in accordance with one aspect of the present invention. A phase error compensation module 92 receives the binary input phase and determines if the lower 3 bits have a value that is greater than or equal to 3. If so, the phase error compensation module 92 will subtract a value of "1" from the binary input phase (via a phase compensation algorithm) to generate a compensated phase input. The compensated phase will then be applied to the phase shifter 90 (which contains the cascade of binary phase-shift stages shown in FIG. 6). In this manner, as illustrated in Table 3 above, a phase rotation of −7.125° will initially be applied to the integer phase (when the lower three bits have decimal equivalents greater than or equal to 3) in order to compensate for the phase error associated with the lower three bits of the binary integer phase that results from the approximated complex multiplier values.

Figure 9:
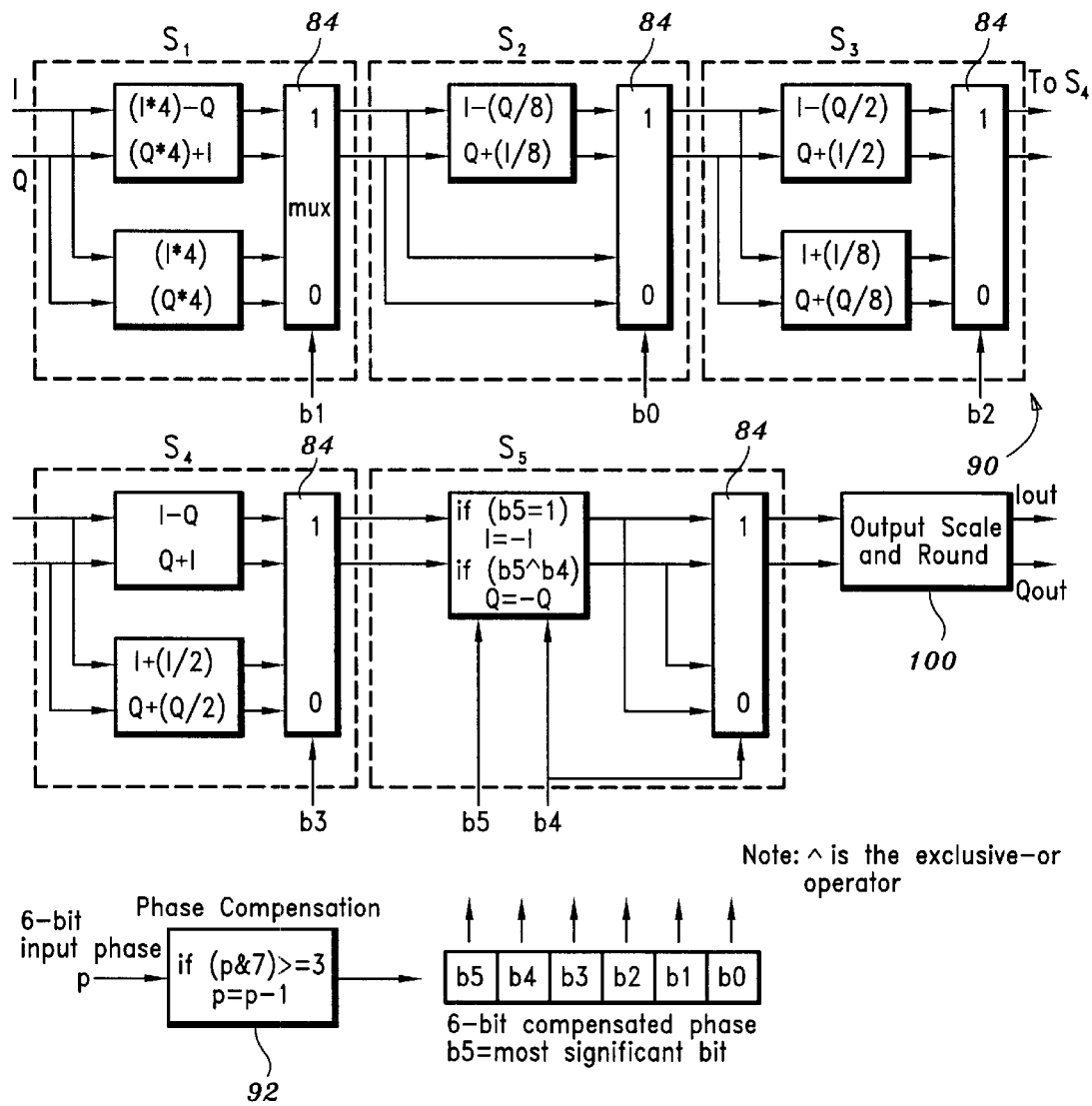
FIG. 9 is a block/flow diagram which illustrates a phase shifter in accordance with an embodiment of the present invention.

Referring now to FIG. 9, a block/flow diagram illustrates an embodiment of the phase shifter having phase shift and gain compensation in each phase-shift stage. As explained above with reference to FIG. 8, a six-bit input phase is first compensated by subtracting one from its value if the low three phase bits of the 6-bit binary integer phase have a value greater than or equal to three. In this embodiment, the compensated phase value drives a five-stage binary phase-shifter cascade. The first stage S1 applies a multiplication of (4+j1) in the rotated path and (4+j0) in the non-rotated path for phase bit b1. The second stage S2 applies a multiplication of (1+j⅛) in the rotated path, and (1+j0) in the non-rotated path for phase bit b0. The third stage S3 applies a multiplication of (1+j0.5) in the rotated path, and (0.125+j0) in the non-rotated path for phase bit b2. The fourth stage S4 applies a multiplication of (1+j1) in the rotated path and (1.5+j0) in the non-rotated path for phase bit b3. The fifth stage S5 handles rotation by π and π/2 efficiently using one conditional negate based on the values of phase bits b4 and b5. The final output multiplexer in stage five S5 reverses the order of the I/Q data if bit phase b4 (corresponding to rotation by π/2) is 1.

As shown in FIG. 9, each phase-shift stage of the phase shifter 90 routes either the phase-shifted or non-phase-shifted I and Q data through a 2:1 multiplexer 84 which is controlled by the appropriate binary bit from the integer phase. Each multiplexer selects either the two upper signals or the two lower signals to be output. The logic "1" or "0" which is placed next to the signal lines represent the signal lines which are selected for output when the input phase control bit is equal to that value. The final outputs of the phase shifter 90 may be scaled and rounded in module 100 as may be required for numerical precision for a particular hardware system design. A summary of the phase-shifter path multipliers for the implementation in FIG. 9 is given in Table 4 below.

TABLE 4

| | | Phase Shifter Multipliers | |
|---|---|---|---|
| Phase Bit | Rotation | Rotated Path Multiplier | Non-Rotated Path Multiplier |
| b5 | π | −1 + j0 | 1 + j0 |
| b4 | π/2 | 0 + j1 | 1 + j0 |
| b3 | π/4 | 1 + j1 | 1.5 + j0 |
| b2 | π/8 | 1 + j0.5 | 1.125 + j0 |
| b1 | π/16 | 4 + J1 | 4 + j0 |
| b0 | π/32 | 1 + j0.125 | 1 + j0 |

As shown in FIG. 9 and Table 3 above, a complex multiplier of 4+j is used for bit b1 in FIG. 9 whereas Table 1 shows the multiplier for b1 being equal to 1+j0.25. The complex multiplier of 4+j1 is used in the first stage of FIG. 9 to increase the magnitude of the input samples by a factor of 4, or two binary bits. This magnitude scaling is done to provide increased precision in the computations of the integer implementation of the phase shifter.

It is to be understood that the ordering and level scaling of the binary-shift stages has no impact on the input/output transfer function outside of an (ideally) constant magnitude scale. In an integer implementation such as shown in FIG. 9, it may be advantageous to order the binary phase-shift stages in a particular sequence to exploit optimal numerical precision and/or output level scaling. For example, in FIG. 9, bit b1 is processed before bit b0. This ordering of phase shift stages is optimized to maintain adequate numerical precision for an integer implementation while providing a desired output signal level.

Figure 10:
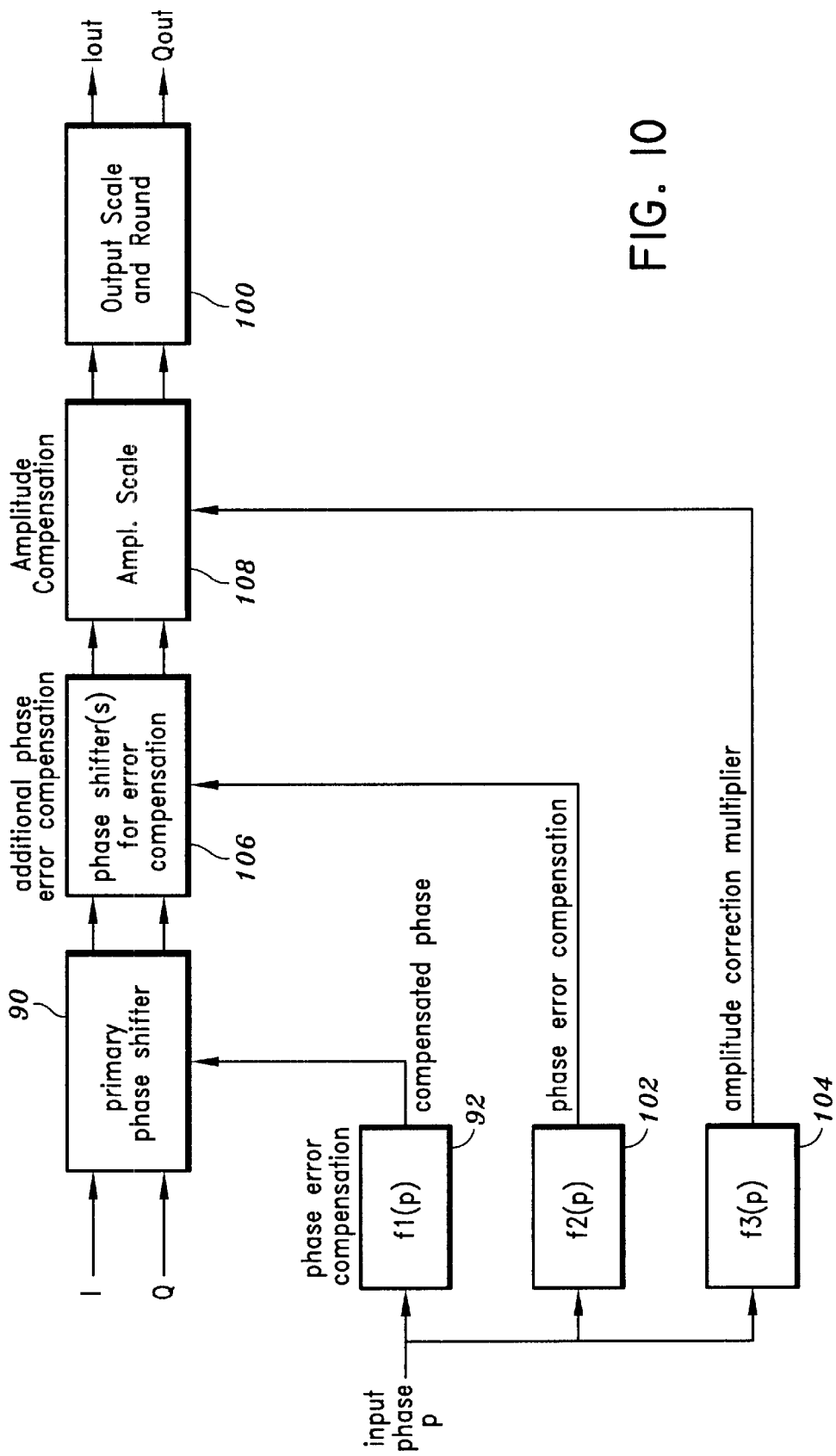
FIG. 10 is a block/flow diagram which illustrates a digital phase shifter in accordance with another embodiment of the present invention.

Referring now to FIG. 10, a block diagram illustrates a phase shifter having generalized phase and amplitude compensation in accordance with another embodiment of the present invention. In particular, in the embodiment of FIG. 10, the phase error compensation is generalized for phase shifters that are designed for higher levels of phase precision. In this system, an input phase is sent through compensation function f1(p) 92 which produces a compensated output phase to drive the primary phase shifter 90 (similar to the embodiment shown in FIG. 8). The input phase is also sent through compensation function f2(p) 102, which computes a correction phase value for an auxiliary phase shifter 106 which is designed to reduce the residual phase error that results from correction function f1(p) in conjunction with the primary phase shifter 90. For amplitude correction, the phase is sent through function f3(p) 104, which computes an amplitude correction multiplier value as a function of input phase. The multiplier is applied to an amplitude scale module 108 which scales the magnitude of the I/Q samples coming from the-phase shift network(s) 90 and 106 to produce an output value with the desired amplitude error tolerance. In other words, the amplitude scaling module 108 may optionally be implemented to compensate for the aggregate amplitude errors induced by the entire sequence of binary phase-shift stages in the primary phase shifter 90 and the auxiliary phase shifter 106 similar to the manner by which the phase error compensation blocks are designed to compensate for the aggregate phase error through the entire sequence of binary shifters. The output may be scaled and rounded in module 100, which (as stated above) may be required for numerical precision for the given hardware system design.

It is to be understood that the +−3° error and the small amplitude error that results with the system shown in FIG. 8 (i.e., where f2(p)=0 and f3(p)=1.0) is sufficiently accurate for QPSK systems. For modulation systems employing higher order constellations, or other applications where higher accuracy is required, the generalized compensation network shown in FIG. 10 may be implemented.

Advantageously, the present digital phase shifter implementation provides a reduction of hardware resources, which results in a savings in both cost and power consumption for hardware implementation of, e.g., a digital PLL, or any hardware-based digital signal processing algorithm utilizing phase-shifting functionality. Indeed, the present invention has application in a wide range of digital communications systems such as satellite modems, high-speed wireless networking modems, and any other hardware design which requires a complex phase shift, such as a tuneable digital local oscillator (LO) or complex equalizer. The present phase-shift process can be applied to enhance the instruction set of a programmable digital signal processor (DSP) since it allows the implementation of a single instruction complex mixer which performs the operations described above. Indeed, the conventional DSP would be required to compute a complex exponential followed by a full complex multiply operation to achieve the functionality which could be achieved in one instruction using the phase shifting methods described herein.

Although the illustrative embodiments of the present invention have been described herein with reference to the accompanying drawings, it is to be understood that the invention is not limited to those precise embodiments, and that various other changes and modifications may be affected therein by one skilled in the art without departing from the true scope or spirit of the invention. All such changes and modifications are intended to be included within the scope of the invention as defined by the appended claims.

What is claimed is:

1. A phase mixing apparatus for applying a phase shift to a complex digital signal, comprising:
    a plurality of phase-shift stages arranged in a cascade, each phase shift stage being associated with a bit of an N-bit binary-weighted phase control signal, and each phase shift stage having a phase shift value associated therewith corresponding to a phase weight of the associated bit, wherein in response to a given N-bit binary-weighted phase control signal, each of said plurality of phase shift stages selectively applies said corresponding phase shift value to said complex digital signal based on a logic level of the associated bit.

2. The apparatus of claim 1 wherein $N \geq 6$.

3. The apparatus of claim 1, wherein said cascade of phase-shift stages has amplitude scaling means operatively connected thereto for providing amplitude compensation for the signal output from said cascade.

4. The apparatus of claim 1, further comprising phase error compensation means for applying a phase compensation value to said N-bit binary weighted phase control signal to produce a phase compensated N-bit binary weighted phase control signal, said compensated N-bit binary weighted phase control signal being applied to said phase mixing apparatus in order to initially reduce phase error resulting from said phase shift values applied by said phase-shift stages of said phase mixing apparatus.

5. The system of claim 1, wherein the phase shift value of at least one phase-shift stage is an approximation of a prescribed phase shift such that the phase shift is realized with one of a binary adder, shifter, negate or a combination thereof.

6. The apparatus of claim 1, wherein each of said phase-shift stages comprises:
    a phase-shift path for applying said corresponding phase shift value to said input signal;
    a non-phase-shift path for passing said input signal without applying said corresponding phase shift value; and
    a multiplexing means for selectively switching between said phase-shift path and said non-phase-shift path.

7. The apparatus of claim 6, wherein said multiplexing means in each of said phase-shift stages is responsive to the logic level of the associated bit of the N-bit binary weighted phase control signal.

8. The apparatus of claim 7, wherein said phase shift value of said corresponding phase-shift stage is applied to an input signal when said associated bit of the N-bit binary weighted phase control signal is logic "1" and wherein said phase shift value of said corresponding phase-shift stage is not applied to said input signal when said associated bit of the N-bit binary weighted phase control signal is logic "0".

9. The apparatus of claim 6, wherein said non-phase-shift path of at least one phase-shift stage in said cascade includes amplitude compensation means for amplitude scaling said signal passing through said non-phase-shift path.

10. The apparatus of claim 9, wherein said amplitude compensation means scales said signal in accordance with an amplitude multiplier that is associated with the phase-shift applied to said input signal in said phase-shift path so as to maintain amplitude gain balance between said phase-shift path and said non-phase-shift path of said phase shift stage.

11. A method for applying a phase shift to a complex digital signal, comprising the steps of:
    successively inputting a complex signal to each of a plurality of cascaded phase-shift stages, each phase-shift stage being associated with a bit of an N-bit binary weighted phase control signal, and each phase-shift stage having a phase shift value associated therewith corresponding to a phase weight of the associated bit; and
    selectively applying said phase shift value to the complex digital signal by each of said phase-shift stages based on a logic level of the associated bit.

12. The method of claim 11, wherein said step of selectively applying said phase shift value comprises the substeps of:
    adding said corresponding phase weight of the bit associated with said phase-shift stage when said bit is of a first logic state; and
    passing said signal through said phase-shift stage without adding said phase weight when said bit is of a second logic state.

13. The method of claim 12, further comprising the step of:
    applying an amplitude compensation factor to said signal in at least one of said phase-shift stages when said signal is passed through said phase-shift stage without being phase-shifted.

14. The method of claim 11, further comprising the step of applying an amplitude compensation scale to said signal to compensate phase-dependant amplitude distortion.

15. The method of claim 11, further comprising the steps of:
    applying a phase compensation value to said N-bit binary weighted phase control signal to produce a phase compensated N-bit binary weighted phase control signal; and applying said phase compensated N-bit binary weighted phase control signal to said plurality of phase-shift stages to reduce phase error resulting from phase-shift stages.

16. The method of claim 13, wherein N≧6.

17. A phase mixing apparatus for applying a phase shift to a complex digital signal, comprising:

a first phase shifter comprising a plurality of phase-shift stages arranged in a cascade, each phase-shift stage being associated with a bit of an N-bit binary-weighted phase control signal, and each phase-shift stage having a phase shift value associated therewith corresponding to a phase weight of the associated bit, wherein in response to a given N-bit binary-weighted phase control signal, each of said plurality of phase-shift stages selectively applies said corresponding phase shift value to said complex digital signal based on a logic level of the associated bit;

a first compensation module, connected to the first phase shifter, for computing a first phase compensation value based on the N-bit binary-weighted phase control signal, for compensating a phase error provided by the first phase shifter;

a second phase shifter, connected to the output of the first phase shifter, for compensating residual phase error resulting from the first phase compensation value applied to the first phase shifter; and a second compensation module, connected to the second phase shifter, for computing a second phase compensation value based on the N-bit binary-weighted phase control, the second phase compensation value being applied to the second phase shifter to compensate for the residual phase error.

18. The phase mixing apparatus of claim 17, further comprising:

a third compensation module for computing an amplitude correction value based on the N-bit binary-weighted phase control signal, for compensating amplitude error resulting from the first and second phase shifters.

19. The phase mixing apparatus of claim 17, further comprising a scaling module for one of scaling, rounding, or both, the amplitude of the complex signal output from the phase mixing apparatus.

20. The phase mixing apparatus of claim 17, wherein the phase shift value of at least one phase-shift stage is an approximation of a prescribed phase shift such that the phase shift is realized with one of a binary adder, shifter, negate or a combination thereof.

* * * * *